(12) United States Patent
Ito et al.

(10) Patent No.: US 7,026,205 B2
(45) Date of Patent: Apr. 11, 2006

(54) METHOD FOR MANUFACTURING SEMICONDUCTOR DEVICE, INCLUDING MULTIPLE HEAT TREATMENT

(75) Inventors: Takayuki Ito, Kawasaki (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 10/815,931

(22) Filed: Apr. 2, 2004

(65) Prior Publication Data
US 2004/0259302 A1    Dec. 23, 2004

(30) Foreign Application Priority Data
Apr. 3, 2003    (JP) .............................. 2003-100612

(51) Int. Cl.
*H01L 21/8238*    (2006.01)
*H01L 21/8234*    (2006.01)
*H01L 21/336*    (2006.01)

(52) U.S. Cl. .................. 438/199; 438/301; 438/275

(58) Field of Classification Search ................ 438/199, 438/251, 275, 286, 301, 308, 519
See application file for complete search history.

(56) References Cited

U.S. PATENT DOCUMENTS 5,837,572 A * 11/1998 Gardner et al. ............. 438/199
6,512,273 B1 * 1/2003 Krivokapic et al. ........ 438/199
6,777,752 B1 * 8/2004 Osanai et al. ............... 257/350
2004/0018702 A1    1/2004 Ito et al. ..................... 438/530

FOREIGN PATENT DOCUMENTS

JP        06-069149      3/1994
JP      2002-246329      8/2002

* cited by examiner

*Primary Examiner*—Walter L. Lindsay, Jr.
(74) *Attorney, Agent, or Firm*—Finnegan, Henderson, Farabow, Garrett & Dunner, L.L.P.

(57) ABSTRACT

A semiconductor device manufacturing method having forming first and second insulating gate portions spaced from each other on a semiconductor substrate, selectively implanting the first conductivity type impurity ions to the first gate electrode and a surface layer of the semiconductor substrate adjacent to the first insulating gate portion, selectively implanting the second conductivity type impurity ions to the second gate electrode and the surface layer adjacent to the second insulating gate portion, after implanting the first and second conductivity types impurity ions, pre-annealing at a first substrate temperature, and after the pre-annealing, main-activating for the first and second types impurity ions at a second substrate temperature higher than the first substrate temperature for a treatment period shorter than a period of the pre-annealing.

19 Claims, 13 Drawing Sheets

METHOD FOR MANUFACTURING SEMICONDUCTOR DEVICE, INCLUDING MULTIPLE HEAT TREATMENT

CROSS REFERENCE TO RELATED APPLICATIONS

This application is based upon and claims the benefit of priority from the prior Japanese Patent Application No. P2003-100612 filed on Apr. 3, 2003; the entire contents of which are incorporated herein by reference.

BACKGROUND OF THE INVENTION

1. Field of the Invention

The present invention relates to a method for manufacturing a semiconductor device, and more particularly, to heat treatments necessary for processes of diffusing and activating impurities.

2. Description of Related Art

Performance improvement in recent large-scale integrated circuits (LSI) has been achieved by enhancing the degree of integration; in other words, by miniaturization of the device configuring the LSI. However, with miniaturization of the device, a parasitic resistance and a short channel effect have been prone to occur. Hence, it becomes important to form shallow and low-resistant impurity diffusion regions (source/drain regions) in order to prevent the parasitic resistance and the short channel effect.

In order to lower the resistance of the impurity diffusion regions, it is important to fully activate impurities by use of a high-temperature annealing treatment such as a rapid thermal annealing (RTA) treatment utilizing a halogen lamp.

Meanwhile, shallow formation of the impurity diffusion regions is realized by implanting impurity ions by means of low acceleration energy and by optimizing the subsequent annealing treatment. For example, in a flash lamp annealing method using a xenon (Xe) flash lamp, the xenon flash lamp emits white light for 10 msec or less, thereby instantaneously supplying the energy necessary to activate the impurities. Hence, the low-resistant and shallow impurity diffusion regions can be formed. Specifically, the flash lamp annealing method enables the impurities implanted into monocrystalline silicon to be activated without changing the distribution of the impurity ions at all. It should be noted that by use of an excimer laser capable of pulse oscillation, the low-resistant and shallow impurity diffusion regions can be similarly formed.

However, in the RTA treatment using the halogen lamp, diffusion coefficients of the impurities such as boron (B), phosphorus (P) and arsenic (As) in the monocrystalline silicon are large, and therefore, the impurities are diffused inside and outside the monocrystalline silicon, thus making it difficult to form a shallow impurity diffusion layer. When lowering the annealing temperature for the purpose of restricting the diffusion of the impurities, the activation ratio of the impurities is greatly lowered. Hence, in accordance with the RTA treatment using the halogen lamp, it is difficult to form the low-resistant and shallow impurity diffusion regions.

Meanwhile, in the flash lamp annealing method, impurity ions implanted simultaneously into a polycrystalline gate electrode when implanting the impurity ions into the impurity diffusion regions are not diffused either, rather, they suffer from the annealing time which is extremely short. Therefore, the impurity ions implanted into the polycrystalline gate electrode are not diffused entirely into the polycrystalline gate electrode, and a highly resistive region in which impurity concentration is low is formed in a part of the polycrystalline gate electrode. This resistance increase of the gate electrode lowers the driving power of the transistor. Specifically, in accordance with the flash lamp annealing method, even if the low-resistant and shallow impurity diffusion regions can be formed, it is impossible to form a high-performance micro transistor.

SUMMARY OF THE INVENTION

An aspect of the present invention provides a method for manufacturing a semiconductor device having forming first and second insulating gate portions to be spaced from each other on a semiconductor substrate, the first insulating gate portion including a first gate insulating film and a first gate electrode doped with an impurity of a first conductivity type, and the second insulating gate portion including a second gate insulating film and a second gate electrode doped with an impurity of a second conductivity type, selectively implanting impurity ions of the first conductivity type to the first gate electrode and a surface layer of the semiconductor substrate adjacent to the first insulating gate portion, selectively implanting impurity ions of the second conductivity type to the second gate electrode and the surface layer adjacent to the second insulating gate portion, after implanting the impurity ions of the first and second conductivity types, performing pre-annealing at a first substrate temperature, and after the pre-annealing, performing main activation for the impurity ions of the first and second types at a second substrate temperature higher than the first substrate temperature for a treatment period shorter than a period of the pre-annealing.

DETAILED DESCRIPTION OF EMBODIMENTS

Figure 1:
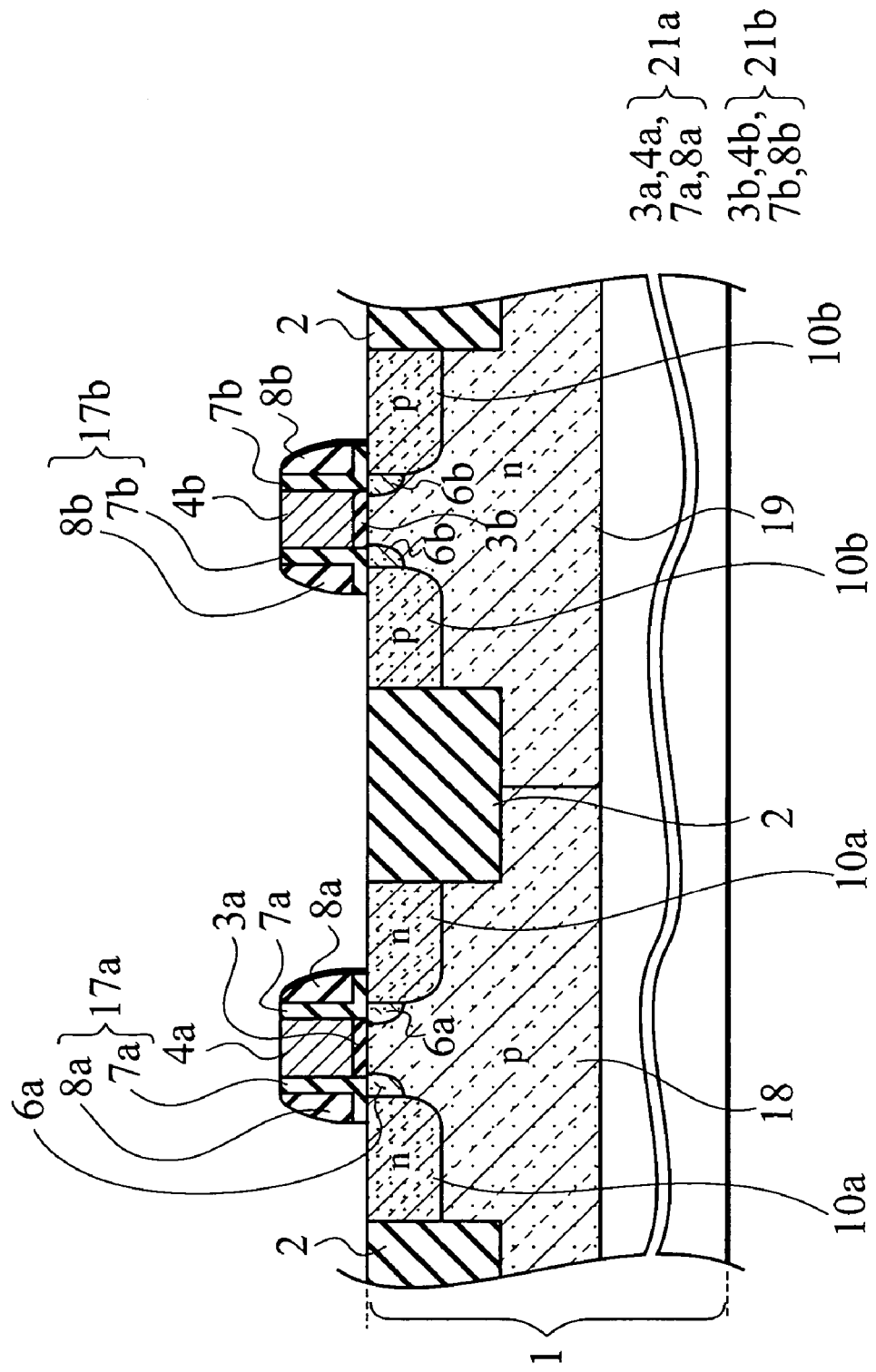
FIG. 1 is a cross-sectional diagram illustrating an example of a semiconductor device manufactured in accordance with a method for manufacturing a semiconductor device according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

A "first conductivity type" and a "second conductivity type" are conductivity types opposite to each other. If the first conductivity type is n type, then the second conductivity type is p type. Conversely, if the first conductivity type is p type, then the second conductivity type is n type. The embodiment of the present invention will be described in the case where the first conductivity type is n type and the second conductivity type is p type.

(First Embodiment)

<Semiconductor Device>

First, a semiconductor device manufactured in accordance with a method for manufacturing a semiconductor device according to the embodiment of the present invention will be described. As illustrated in FIG. 1, the p-well 18 and the n-well 19 are disposed adjacent to each other on an upper portion including the surface of the semiconductor substrate 1 made of monocrystalline silicon. On the outer circumferential portions of the p-well 18 and the n-well 19 in the upper portion including the surface of the semiconductor substrate 1, the device isolation region 2 is embedded.

The insulating gate portion 21a is disposed on the surface of the p-well 18. The insulating gate portion 21a includes the gate insulating film 3a disposed on the surface of the p-well 18, the gate electrode 4a disposed on the gate insulating film 3a, and the sidewall spacer 17a disposed adjacent to the side faces of the gate insulating film 3a and gate electrode 4a on the surface of the p-well 18. The sidewall spacer 17a includes the silicon nitride ($Si_3N_4$) film 7a disposed along the side faces of the gate insulating film 3a and gate electrode 4a and along the surface of the p-well 18, and the silicon oxide ($SiO_2$) film 8a disposed on the silicon nitride film 7a. The extension region 6a is disposed on the surface layer of the p-well 18 adjacent to the gate electrode 4a. The source/drain region 10a is disposed on the surface layer of the p-well 18 spaced from the gate electrode 4a.

The insulating gate portion 21b is disposed on the surface of the n-well 19. The insulating gate portion 21b includes the gate insulating film 3b disposed on the surface of the n-well 19, the gate electrode 4b disposed on the gate insulating film 3b, and the sidewall spacer 17b disposed adjacent to the side faces of the gate insulating film 3b and gate electrode 4b on the surface of the n-well 19. The sidewall spacer 17b includes the silicon nitride film 7b disposed along the side faces of the gate insulating film 3b and gate electrode 4b and along the surface of the n-well 19, and the silicon oxide film 8b disposed on the silicon nitride film 7b. The extension region 6b is disposed on the surface layer of the n-well 19 adjacent to the gate electrode 4b. The source/drain region 10b is disposed on the surface layer of the n-well 19 spaced from the gate electrode 4b.

Each of the p-well 18, the extension region 6b and the source/drain region 10b is a region where a III-group element such as boron (B) becoming a p-type impurity is doped to the semiconductor substrate 1 made of monocrystalline silicon. Each of the n-well 19, the extension region 6a and the source/drain region 10a is a region where a V-group element such as phosphorus (P) and arsenic (As) becoming an n-type impurity is doped to the semiconductor substrate 1 made of monocrystalline silicon. The gate electrode 4a is made of polycrystalline silicon (polysilicon) doped with the n-type impurity. The gate electrode 4b is made of polycrystalline silicon doped with the p-type impurity. Each of the device isolation region 2, the gate insulating films 3a and 3b and the sidewall spacers 17a and 17b is made of an insulator such as silicon oxide, silicon nitride and silicon oxide nitride.

An n-type conductivity layer that electrically connects the source and drain of the source/drain region 10a to each other, that is, an n-channel is formed immediately under the gate electrode 4a by controlling, for the p-well 18, a voltage applied to the gate electrode 4a. A p-type conductive layer that electrically connects the source and drain of the source/drain region 10b to each other, that is, a p-channel is formed immediately under the gate electrode 4b by controlling, for the n-well 19, a voltage applied to the gate electrode 4b. As described above, the semiconductor device according to the first embodiment has a CMOS structure formed of an n-channel MOS type field-effect transistor (nMOS transistor) and a p-channel MOS type field-effect transistor (pMOS transistor).

<Method for Manufacturing a Semiconductor Device>

Next, a method for manufacturing the semiconductor device illustrated in FIG. 1 will be described with reference to FIGS. 2A to 2C, 3A, 3B, 4A and 4B.

Figure 2A:
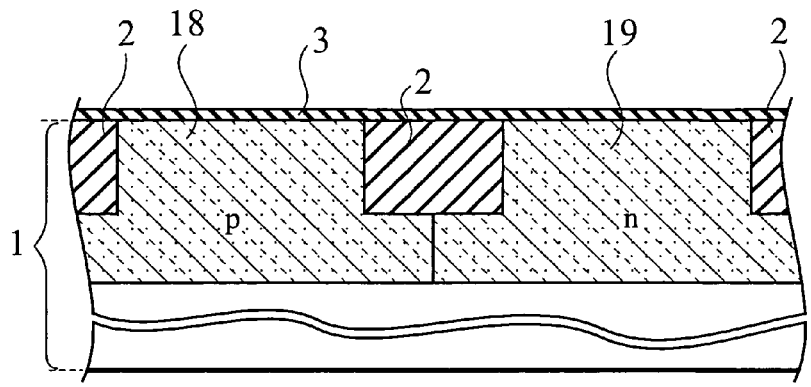
FIGS. 2A to 2C, 3A, 3B, 4A and 4B are cross-sectional diagrams individually illustrating principal manufacturing stages in the method for manufacturing a semiconductor device according to the embodiment of the present invention.

(A) First, p-type and n-type impurity ions are selectively implanted from the surface of the semiconductor substrate 1 by use of a lithography method and an ion implantation method. Thereafter, a heat treatment for activating the implanted ions is performed, and thus, as illustrated in FIG. 2A, the p-well 18 and the n-well 19 are formed adjacent to each other on the upper portion including the surface of the semiconductor substrate 1. Following this, the upper portion of the semiconductor substrate 1 on the outer circumferential portions of the p-well 18 and n-well 19 is selectively removed by use of a lithography method and an anisotropic etching method such as a reactive ion etching (RIE) method, thus forming a trench. An insulator is selectively embedded into the trench by use of a chemical vapor deposition (CVD) method and a chemical mechanical polishing (CMP) method, thus forming the device isolation region 2. Then, for example, the insulating film (silicon oxide film) 3 is uniformly deposited on the surface of the semiconductor substrate 1 by use of the CVD method.

Figure 2B:
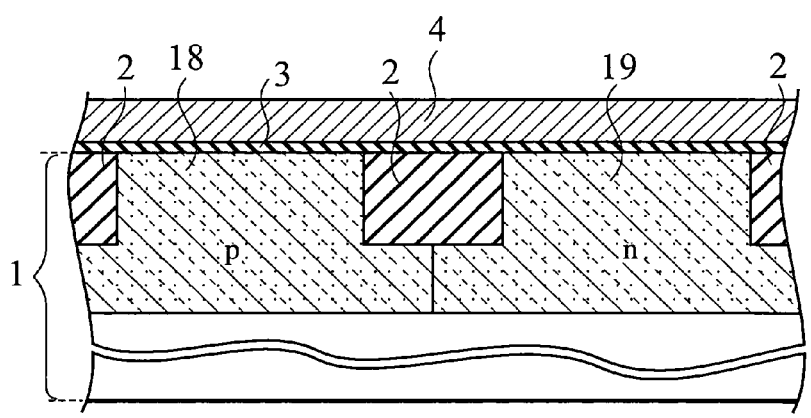

(B) Next, as illustrated in FIG. 2B, a polycrystalline conductive film (polycrystalline silicon film) doped with the n-type impurity is formed on the silicon oxide film 3. Specifically, the polycrystalline silicon film 4 substantially made of an intrinsic semiconductor is deposited on the silicon oxide film 3 by use of the CVD method. The n-type impurity ions are implanted entirely into the polycrystalline silicon film 4 by use of the ion implantation method. For example, phosphorus ions are implanted such that a concentration thereof can be $10^{19}$ cm$^{-3}$ or more. Thereafter, a heat treatment is performed, and the n-type impurity ions are diffused into the polycrystalline silicon film 4. For example, a heat treatment at 900° C. for approximately 10 minutes is conducted, whereby the phosphorus ions are uniformly diffused into the entire polycrystalline silicon film 4. This process of diffusing the n-type impurity ions into the polycrystalline silicon film 4 can be conducted by an infrared lamp such as a halogen lamp, or an electric furnace or hot plate operated by resistance heating.

Figure 2C:
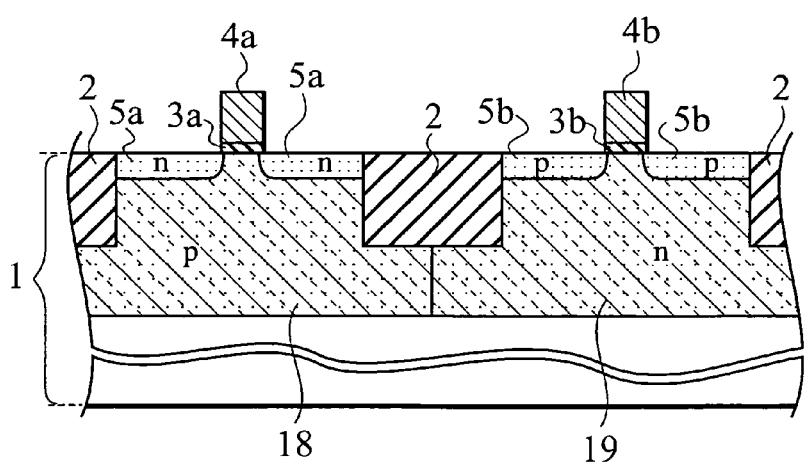

(C) Next, the silicon oxide film 3 and the polycrystalline silicon film 4 are selectively removed by use of the photolithography method and the RIE method, and, as illustrated in FIG. 2C, the gate insulating films 3a and 3b and the gate electrodes 4a and 4b are formed. Thereafter, the n-type impurity ions are selectively implanted into the upper portion including the surface of the p-well 18 by use of the lithography method and the ion implantation method. For example, arsenic (As) ions are implanted by acceleration energy of 1 keV in a dose of $1 \times 10^{15}$ cm$^{-2}$. In this case, the gate electrode 4 serves as a mask for implanted ions, and the first impurity region 5a is formed on the surface layer of the p-well 18, where the gate electrode 4a is not formed. Similarly, the p-type impurity ions are selectively implanted into the upper portion including the surface of the n-well 19. For example, boron (B) ions are implanted by acceleration energy of 0.2 keV in a dose of $1 \times 10^{15}$ cm$^{-2}$. In this case, the gate electrode 4b serves as a mask for implanted ions, and the first impurity region 5b is formed on the surface layer of the n-well 19, where the gate electrode 4b is not formed.

Figure 3A:
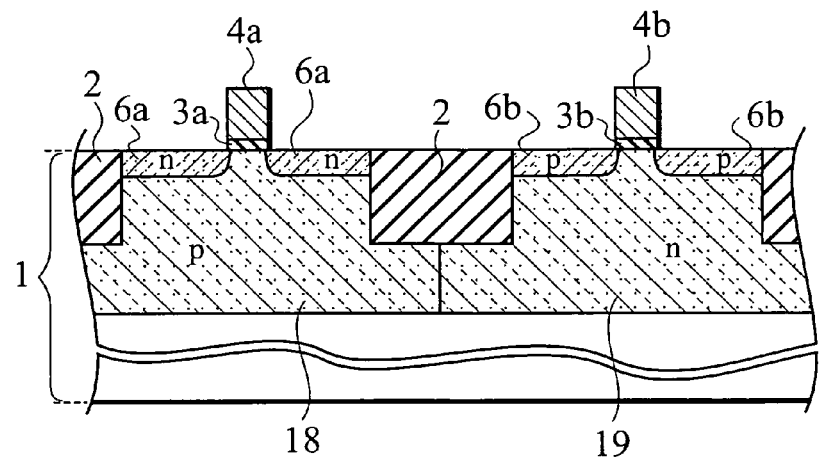

(D) Next, light from a xenon (Xe) flash lamp is irradiated onto the entire surface of the semiconductor substrate 1 in a state where the surface is heated up to approximately 400° C. This heat treatment is referred to as "sub-activation" below. Irradiation time (treatment period) is set at 1 ms, and surface density of the irradiation energy is set at 35 J/cm$^2$. Through sub-activation, the impurity elements implanted into the first impurity regions 5a and 5b illustrated in FIG. 2C are activated, and crystal defects of the first impurity regions 5a and 5b are recovered. Specifically, as illustrated in FIG. 3A, the first impurity regions 5a and 5b become the shallow extension regions 6a and 6b adjacent to the gate electrodes 4a and 4b, respectively.

Figure 3B:
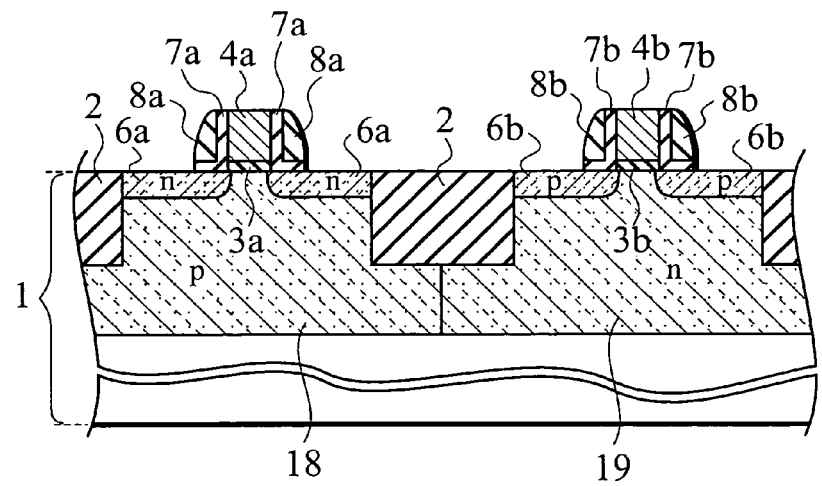

(E) Next, a silicon nitride (Si$_3$N$_4$) and a silicon oxide (SiO$_2$) film are sequentially deposited by use of the CVD method. The silicon nitride film and the silicon oxide film are removed by use of the RIE method, and at the time when the surface of the semiconductor substrate 1 and the upper surfaces of the gate electrodes 4a and 4b emerge, the removal of the silicon nitride film and silicon oxide film is stopped. As illustrated in FIG. 3B, the silicon nitride films 7a and 7b and the silicon oxide films 8a and 8b are selectively left behind, adjacent to the side faces of the gate electrodes 4a and 4b and gate insulating films 3a and 3b, thus forming the sidewall spacers 17a and 17b of a multilayer structure.

Figure 4A:
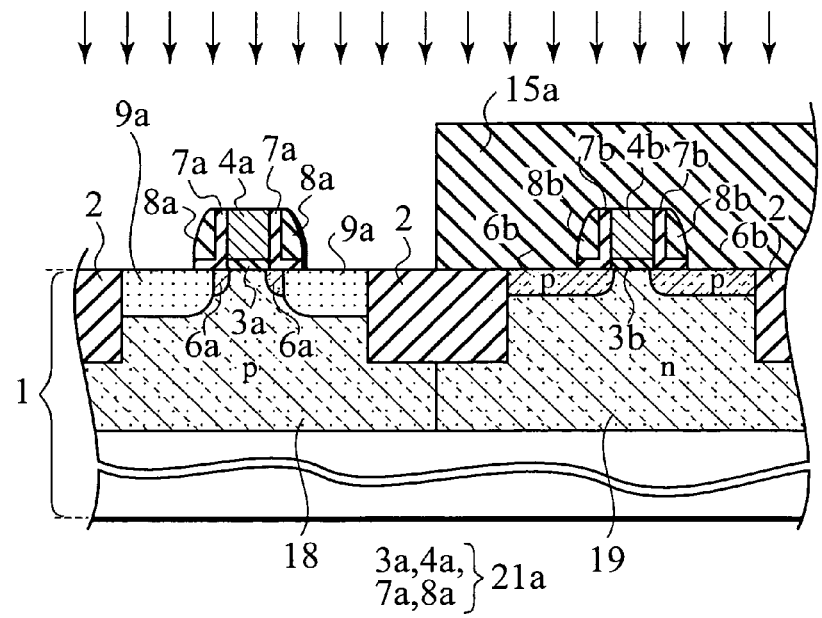

(F) Next, a resist film is formed by a spin-coating method or the like. As illustrated in FIG. 4A, the resist pattern 15a, which has an opening in a region where the p-well 18 is formed, is created by use of the photolithography method. The n-type impurity ions are selectively implanted into the p-well 18 by use of the resist pattern 15a as a mask for the implanted ions. For example, the phosphorus ions are implanted by acceleration energy of 15 keV in a dose of $3 \times 10^{15}$ cm$^{-2}$. In this case, the n-type impurity ions are also implanted into the gate electrode 4a. Moreover, the insulating gate portion 21a becomes the mask for the implanted ions, and the second impurity region 9a is formed on the surface layer of the p-well 18, where the insulating gate portion 21a is not formed. The second impurity region 9a is formed to be spaced from the end portion of the gate electrode 4a and deeper than the extension region 6a. Thereafter, the resist pattern 15a is removed.

Figure 4B:
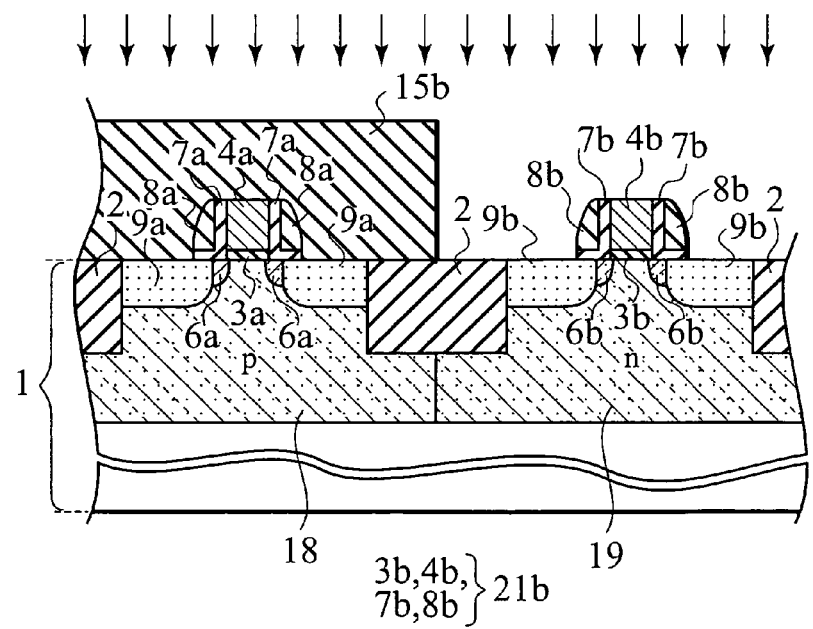

(G) Next, a resist film is formed by the spin-coating method or the like. As illustrated in FIG. 4B, the resist pattern 15b, which has an opening in a region where the n-well 19 is formed, is created by use of the photolithography method. The p-type impurity ions are selectively implanted into the n-well 19 by use of the resist pattern 15b as a mask for the implanted ions. For example, boron ions are implanted by acceleration energy of 5 keV in a dose of $3 \times 10^{15}$ cm$^{-2}$. In this case, the p-type impurity ions are also implanted into the gate electrode 4b, and the conductivity type thereof is inverted from the n type to the p type. In addition, the insulating gate portion 21b becomes a mask for the implanted ions, and the second impurity region 9b is formed on the surface layer of the n-well 19, where the insulating gate portion 21b is not formed. The second impurity region 9b is formed to be spaced from the end portion of the gate electrode 4b and deeper than the extension region 6b. Thereafter, the resist pattern 15b is removed.

(H) Next, a heat treatment is conducted at a "first substrate temperature," at which the n-type and p-type impurity ions implanted into the gate electrodes 4a and 4b are diffused and the diffusion of the n-type and p-type impurity ions implanted into the p-well 18 and the n-well 19 is restricted. This heat treatment is referred to as "pre-annealing" below. For example, the pre-annealing is an RTA treatment using an infrared lamp such as a halogen lamp, or an electric furnace or hot plate operated by resistance heating. Treatment conditions for the pre-annealing are, for example, 850° C. for the first substrate temperature, and 30 seconds for the treatment period. Detailed treatment conditions for the pre-annealing will be described later with reference to FIGS. 5 and 6.

Figure 7:
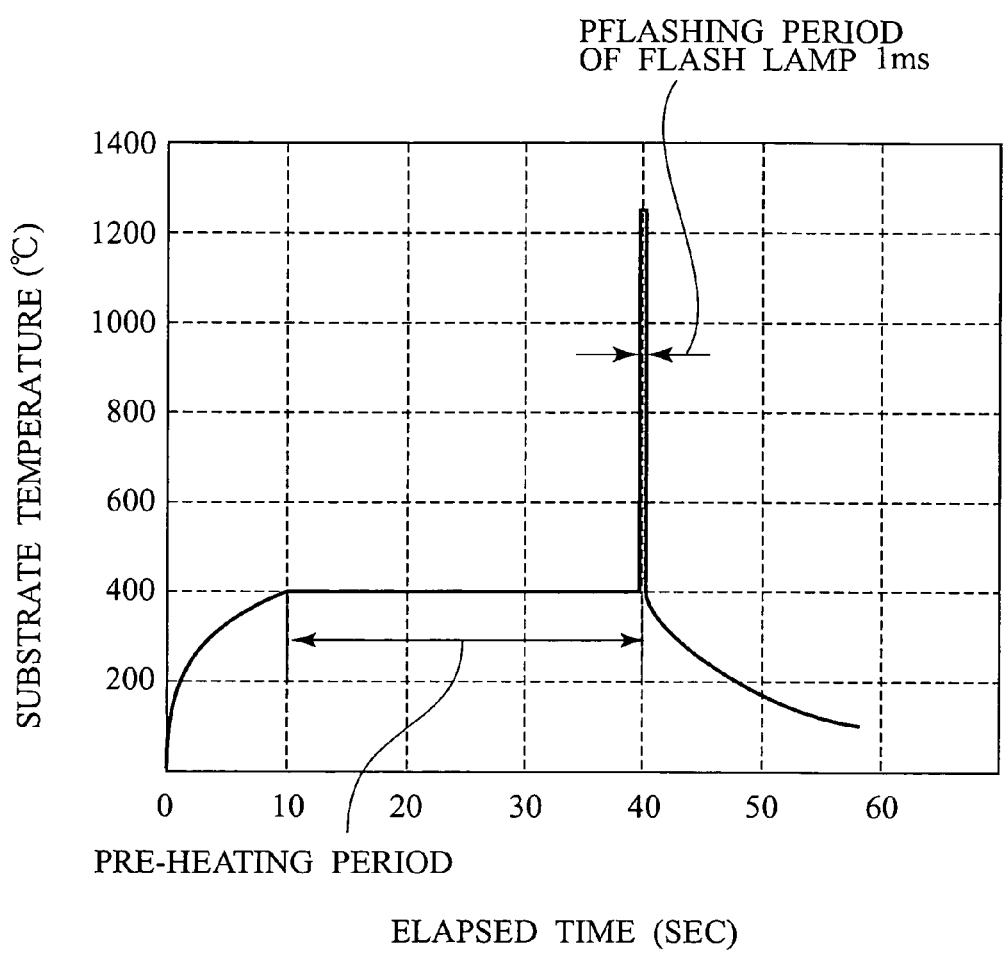
FIG. 7 is a graph showing a relationship between temperatures of the substrate and elapsed times during the pre-heating and main activation.

(I) Next, after the pre-annealing, a heat treatment is conducted at a "third substrate temperature" approximately equal to or less than that of the heat treatment illustrated in FIG. 2B for diffusing the n-type impurity ions into the polycrystalline silicon film 4. This heat treatment is referred to as "pre-heating" below. The pre-heating can be performed by use of the infrared lamp or the hot plate. For example, the third substrate temperature is approximately 400° C. Detailed treatment conditions for the pre-heating will be described later with reference to FIG. 7.

(J) Finally, a heat treatment for activating the n-type and p-type impurity ions implanted into the surface layers of the p-well 18 and n-well 19 is conducted at a "second substrate temperature" higher than the first substrate temperature for a shorter period than that of the pre-annealing. This heat treatment is referred to as "main activation" below. For example, subsequent to the pre-heating, the light from a xenon (Xe) flash lamp is irradiated entirely onto the substrate in a state where the surface of the semiconductor substrate 1 is heated up to approximately 400° C. Irradiation time (treatment period) of the light is set at 1 ms, and surface density of the irradiation energy on the surface of the semiconductor substrate 1 is set at 35 J/cm². Specifically, the main activation is conducted under similar treatment conditions to those of the sub-activation. Detailed treatment conditions for the sub-activation and the main activation will be described later with reference to FIG. 7. Through the main activation, the n-type and p-type impurity elements implanted into the surface layers of the p-well 18 and n-well 19 as illustrated in FIG. 1 are activated, and the crystal defects of the second impurity regions 9a and 9b are recovered. As a consequence, the source/drain regions 10a and 10b deeper than the extension regions 6a and 6b are formed on the surface layers of the p-well 18 and n-well 19 spaced from the end portions of the gate electrodes 4a and 4b, respectively. Through the stages described above, the semiconductor device which has the CMOS structure illustrated in FIG. 1 is completed.

Note that problems do not occur even if the polycrystalline silicon film 4 is deposited in an atmosphere containing the n-type impurity by use of the CVD method in place of depositing the polycrystalline silicon film 4 substantially made of the intrinsic semiconductor and implanting the n-type impurity ions thereto in FIG. 2.

No problems occur even if the RTA treatment using the halogen lamp is performed in place of the sub-activation illustrated in FIG. 3A, which uses the xenon (Xe) flash lamp. With regard to the annealing conditions in the RTA treatment, it is desirable that the substrate temperature be 900° C. or less and that the treatment period be 10 seconds or less. Also by this RTA treatment, the impurity elements implanted into the first impurity regions 5a and 5b are activated without being diffused deeply to the semiconductor substrate 1, and the crystal defects of the first impurity regions 5a and 5b are recovered, thus making it possible to form the extension regions 6a and 6b.

The n-type and p-type impurity ions implanted into the gate electrodes 4a and 4b include the n-type and p-type impurity ions implanted into the gate electrodes 4a and 4b at the time of forming the first impurity regions 5a and 5b illustrated in FIG. 2C and at the time of forming the second impurity regions 9a and 9b illustrated in FIGS. 4A and 4B. Moreover, the n-type and p-type impurity ions implanted into the surface layers of the p-well 18 and n-well 19 include the n-type and p-type impurity ions existing in the first impurity regions 5a and 5b and the second impurity regions 9a and 9b.

<Pre-Annealing>

Figure 5:
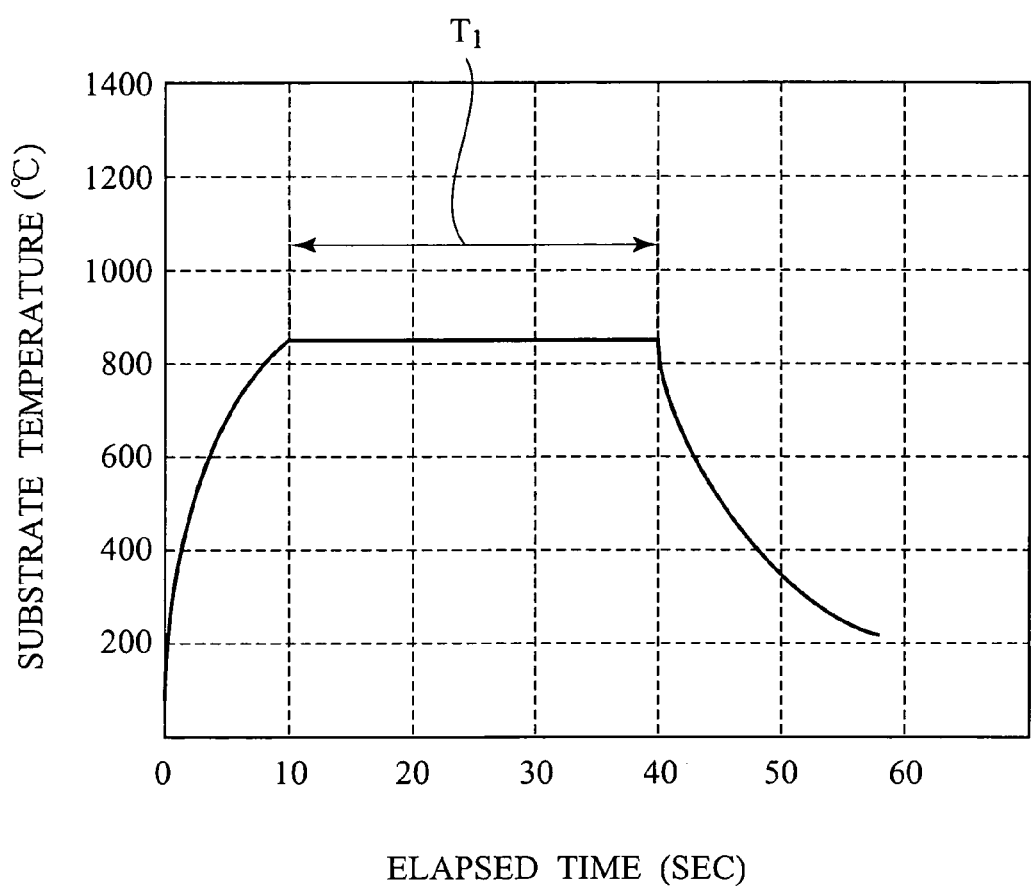
FIG. 5 is a graph showing a relationship between temperatures of a substrate and elapsed times in pre-annealing.

During pre-annealing, the surface of the semiconductor substrate 1 is heated up to the first substrate temperature, and the first substrate temperature is maintained for a treatment period $t_{pa}$. In FIG. 5, the axis of abscissas represents elapsed times from the start of heating the semiconductor substrate 1, and the axis of ordinates represents temperatures of the surface of the semiconductor substrate 1 (substrate temperature). The substrate temperature is measured by calculating a measurement value obtained by actually measuring the temperature of the back surface of the semiconductor substrate 1. In addition, the treatment period $t_{pa}$ represents the period for which the substrate temperature is maintained at the fist substrate temperature. In the example shown in FIG. 5, the first substrate temperature is 850° C.

Figure 6:
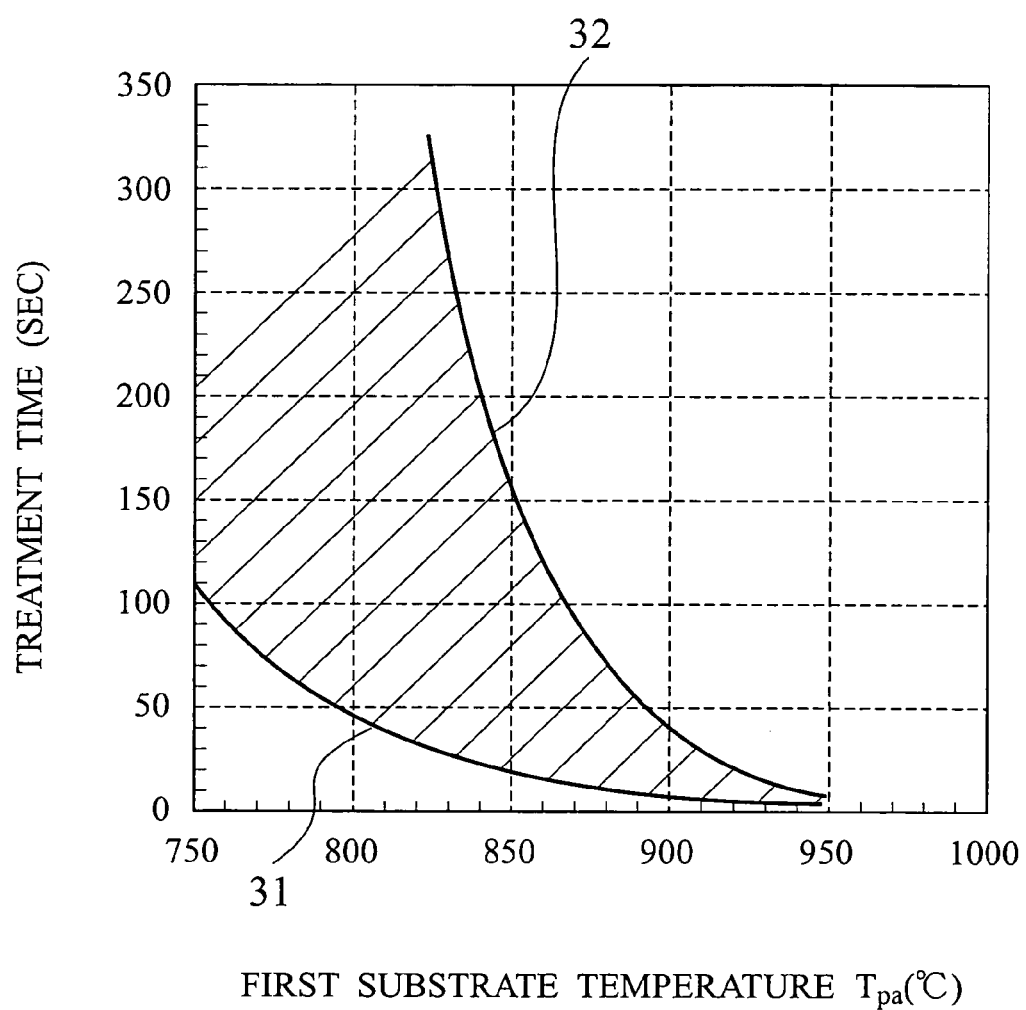
FIG. 6 is a graph showing a relationship between temperatures of a first substrate and treatment periods in the pre-annealing.

As shown in FIG. 6, it is desirable that the first substrate temperature $T_1$ (° C.) and the treatment period $t_{pa}$ (sec) satisfy the treatment conditions defined by the region sandwiched by the first and second boundary lines 31 and 32. When the first temperature $T_1$ is lower than the first boundary line 31 or the treatment period $t_{pa}$ is shorter than the same, the n-type and p-type impurity elements are not fully diffused into the entire gate electrodes 4a and 4b, thus causing the resistance increase of the gate electrodes 4a and 4b. On the other hand, when the first temperature $T_1$ is higher than the second boundary line 32 or the treatment period $t_{pa}$ is longer than the same, the n-type and p-type impurity elements are diffused into the p-well 18 and the n-well 19, and the extension regions 6a and 6b are formed to an undesirable depth of more than 20 nm.

The first boundary line 31 is represented by the equation (1), and the second boundary line 32 is represented by the equation (2). Hence, the first substrate temperature $T_1$ (° C.) and the treatment time $t_{pa}$ (sec) in the pre-annealing satisfy the treatment conditions shown in the equation (3), whereby the depths of the pn junctions of the extension regions 6a and 6b can be maintained at 20 nm or less.

$$t_{pa}=5\times10^{-8}\exp[2.21\times10^4/(T_1+275)] \quad (1)$$

$$t_{pa}=6\times10^{-13}\exp[3.74\times10^4/(T_1+275)] \quad (2)$$

$$5\times10^{-8}\exp[2.21\times10^4/(T_1+275)]<=t_{pa}<=6\times10^{-13}\exp[3.74\times10^4/(T_1+275)] \quad (3)$$

In the treatment conditions shown in FIG. 6 and the equation (3), it is further desirable that the substrate temperature $T_1$ range from 600° C. to 900° C., and preferably, 800° C. to 900° C. In addition, it is desirable that the treatment period for the pre-annealing be in a range from 5 seconds to 1 hour ($3.6\times10^3$ sec).

<Pre-Heating and Main Activation>

The pre-heating is an annealing process, in which the surface of the semiconductor substrate 1 is heated up to the third substrate temperature, and the third substrate temperature is maintained for a certain period (pre-heating period). It is desirable that the third substrate temperature be in a range from 200° C. to 600° C., and preferably, from 300° C. to 500° C. In the example shown in FIG. 7, the third substrate temperature is 400° C., and the pre-heating period is 30 seconds.

The main activation is conducted following pre-heating. Specifically, the main activation is conducted in a state where the temperature of the surface of the semiconductor substrate 1 is maintained at the third substrate temperature. For the main activation, as well as the Xe flash lamp, it is possible to use light sources including a flash lamp that envelopes therein rare gases other than Xe, and an excimer laser and a YAG laser, both of which oscillate laser beams in a pulse shape. It is desirable that treatment time for the main activation, that is, the period for irradiating light emitted from such a light source onto the entire substrate surface (flashing period of flash lamp) be 100 ms or less. Preferably, the flashing period is 10 ms or less, and more preferably, 1 ms or less. In the example shown in FIG. 7, the flashing period of the flash lamp is 1 ms. Moreover, it is desirable that the surface density of the irradiation energy of the light emitted from the light source on the surface of the semiconductor substrate 1 be 100 J/cm² or less, and preferably, 60 J/cm² or less. Note that similar treatment conditions to the above are desirable also for the sub-activation.

FIRST COMPARATIVE EXAMPLE

In a method for manufacturing a semiconductor device according to a first comparative example of the embodiment, in FIG. 2B, the process in which phosphorus ions are implanted entirely into the polycrystalline silicon film 4 by use of the ion implantation method such that the concentration of the phosphorus ions can be $10^{19}$ cm$^{-3}$ or more is omitted. Moreover, the subsequent heat treatment process in which the phosphorus ions are diffused into the polycrystalline silicon film 4 is omitted. Only the process in which the polycrystalline silicon film 4, made substantially of the intrinsic semiconductor, is deposited on the silicon oxide film 3 by use of the CVD method is conducted. Furthermore, in the method for manufacturing a semiconductor device according to the first comparative example, the RTA treatment in the pre-annealing which uses a halogen lamp under the conditions where the substrate temperature is 850° C. and the treatment period is approximately 30 seconds is not performed, but only the annealing using the xenon flash lamp is performed in the main activation. With regard to the other manufacturing processes, the embodiment and the first comparative example are identical to each other.

With regard to the impurity concentration distributions of the gate electrodes 4a and 4b and extension regions 6a and 6b and the gate capacitances of the MOS transistors, the semiconductor device illustrated in FIG. 1 and the semiconductor device manufactured in accordance with the method for manufacturing a semiconductor device according to the first comparative example are compared with each other. Note that the embodiment and the first comparative example are also compared simultaneously with the related art (RTA) in which the RTA treatment using the halogen lamp under conditions where the substrate temperature is 1015° C. and the treatment period is 10 seconds is conducted in place of the pre-annealing and the main activation.

Figure 8A:
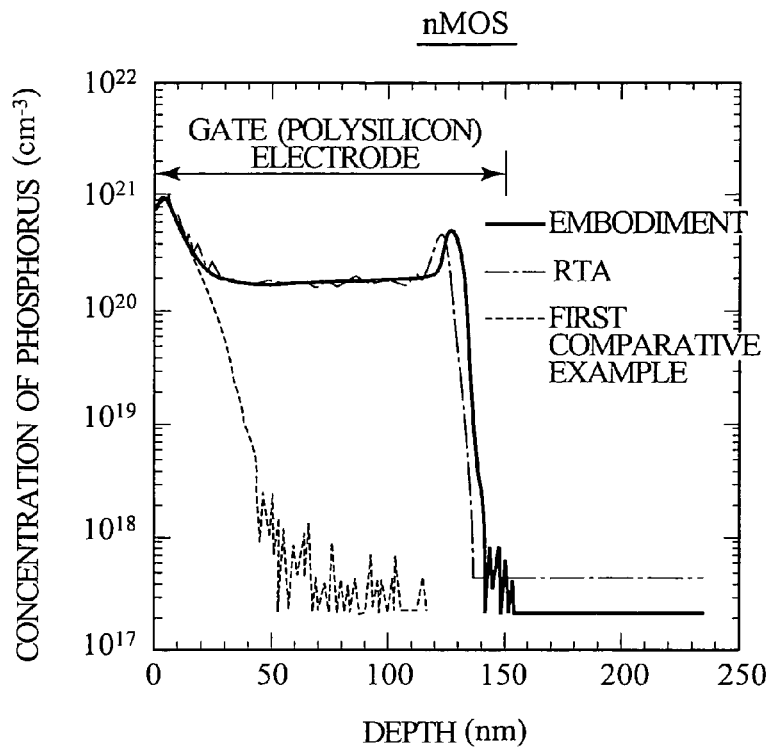
FIG. 8A is a graph showing a distribution of impurity concentrations of a gate electrode of an nMOS transistor according to a first comparative example.
Figure 8B:
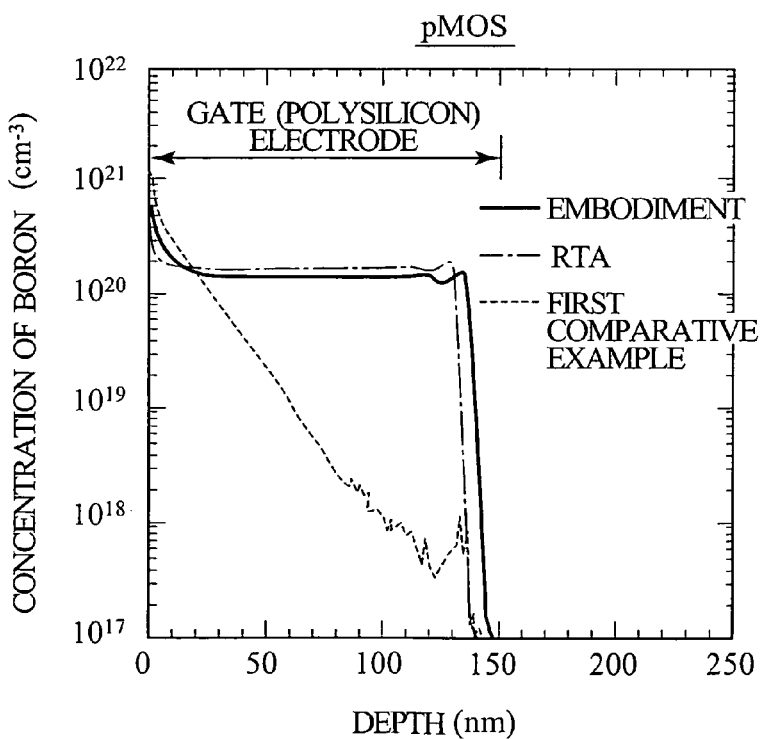
FIG. 8B is a graph showing a distribution of impurity concentrations of a gate electrode of a pMOS transistor according to the first comparative example.

As shown in FIGS. 8A and 8B, the impurity concentration distributions in the gate electrodes 4a and 4b made of polysilicon were investigated by use of secondary ion mass spectrometry (SIMS). The axis of ordinates of FIG. 8A represents concentrations of phosphorus (P) in the gate electrode 4a of the nMOS transistor, and the axis of ordinates of FIG. 8B represents concentrations of boron (B) in the gate electrode 4b of the pMOS transistor. The axes of abscissas of FIGS. 8A and 8B represent depths of the gate electrodes 4a and 4b. As shown in FIGS. 8A and 8B, while the concentrations of the impurities (P and B) are substantially constant in the entire gate electrodes 4a and 4b in the embodiment and the RTA, the impurity concentrations are lowered from the midways of the gate electrodes 4a and 4b in the first comparative example. Specifically, it is understood that, while the impurities are diffused uniformly into the entire gate electrodes 4a and 4b in the embodiment and the RTA, a difference in impurity concentration occurs in the gate electrodes 4a and 4b, the impurity concentrations in the gate bottoms are low, and doped layers of which impurity concentrations are low are formed in the first comparative example.

Figure 9A:
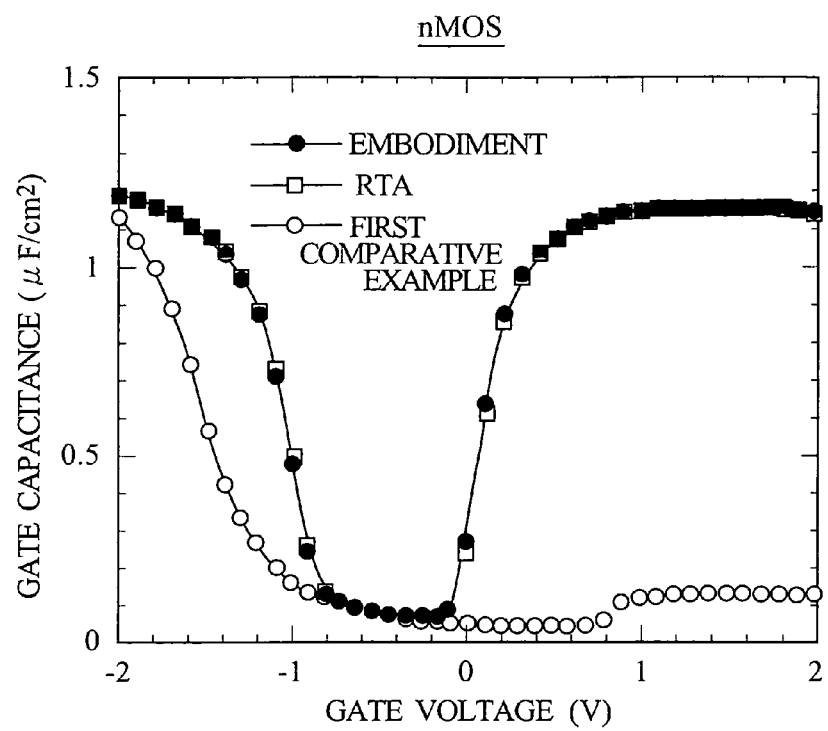
FIG. 9A is a graph showing a relationship between gate capacitances and gate voltages of the nMOS transistor according to the first comparative example.
Figure 9B:
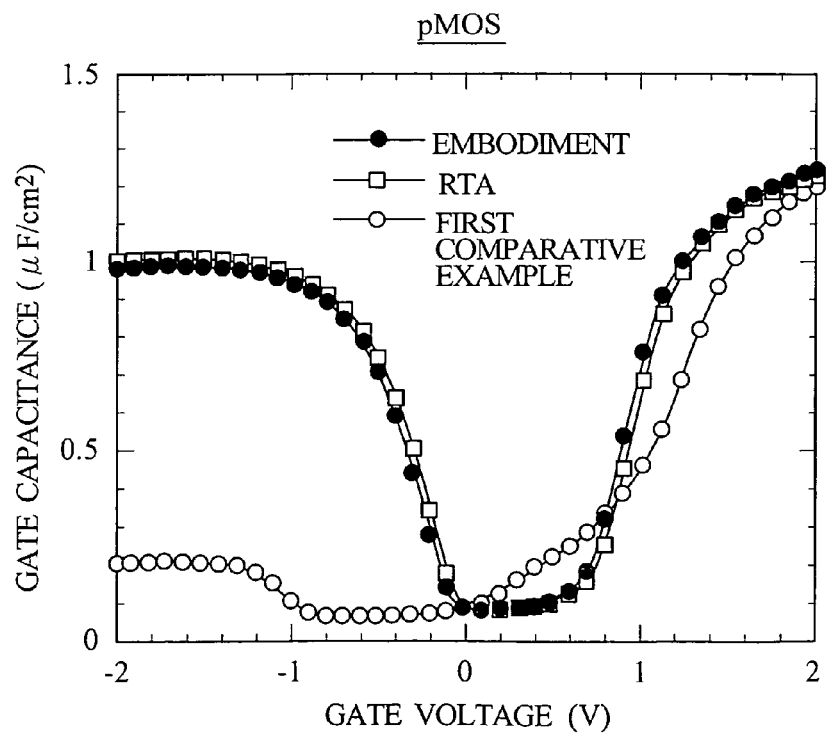
FIG. 9B is a graph showing a relationship between gate capacitances and gate voltages of the pMOS transistor according to the first comparative example.

As shown in FIGS. 9A and 9B, a relationship between the gate capacitance (C) and gate voltage (V) of each of the MOS transistors formed of the gate electrodes 4a and 4b, the gate insulating films 3a and 3b and the wells 18 and 19 was investigated. The axes of ordinates of FIGS. 9A and 9B represent the gate capacitances, and the axes of abscissas thereof represent the gate voltages.

As shown in FIG. 9A, the nMOS transistors according to the embodiment and the RTA substantially coincide with each other in C-V characteristics, and each nMOS transistor has a gate capacitance of approximately 1.15 µF/cm² when the gate voltage is 1.5V. In the first comparative example, the nMOS transistor has a gate capacitance of approximately 0.13 µF/cm² when the gate voltage is 1.5V. This gate capacitance is lower as compared with those of the embodiment and RTA. As shown in FIG. 9B, the pMOS transistors according to the embodiment and the RTA substantially coincide with each other in C-V characteristics, and each pMOS transistor has a gate capacitance of approximately 1.0 µF/cm² when the gate voltage is −1.5V. In the first comparative example, the pMOS transistor has a gate capacitance of approximately 0.2 µF/cm² when the gate voltage is −1.5V. This gate capacitance is lower as compared with those of the embodiment and RTA.

As described above, it is understood that, in the first comparative example, the gate capacitance is lowered, and the gate insulating films under the gate electrodes 4a and 4b are formed apparently thick. This is because, when the impurities (P and B) implanted into the gate electrodes 4a and 4b are activated by use of the xenon flash lamp, the impurities (P and B) are not diffused deeply into the gates, and rather suffer from the extremely short time while the gate electrodes 4a and 4b are being subjected to the high temperature, allowing doped layers with insufficient concentrations to form on the gate bottoms. It was also understood that the insufficiently doped layers of the first comparative example, which were calculated based on the values of the gate capacitances, reached 20 nm or more in thickness with respect to the gate electrodes 4a and 4b with a thickness of 150 nm.

There is a possibility that such a depletion of the gate electrodes 4a and 4b may not only lower the driving power of the transistor but also damage the transistor's functions. However, when the acceleration energy of the impurities implanted into the gate electrodes 4a and 4b in order to control the depletion thereof, the impurities are deeply implanted also into the semiconductor substrate 1, and the extension regions 6a and 6b or the source/drain regions 10a and 10b are formed deep. Furthermore, the impurity diffusion in the direction parallel to the surface of the semiconductor substrate 1 also advances to induce the short channel effect. In addition, the impurities pass through the gate electrodes 4a and 4b to be diffused into the gate insulating films 3a and 3b or the surface region of the semiconductor substrate 1 thereunder, thus fluctuating the threshold voltage of the transistor.

Figure 10A:
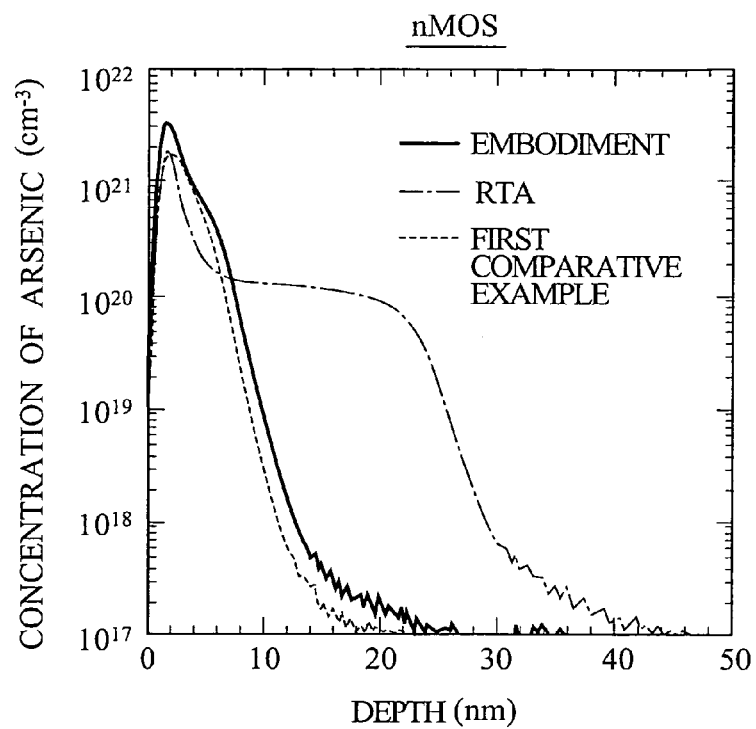
FIG. 10A is a graph showing a distribution of impurity concentrations of an extension region of the nMOS transistor according to the first comparative example.
Figure 10B:
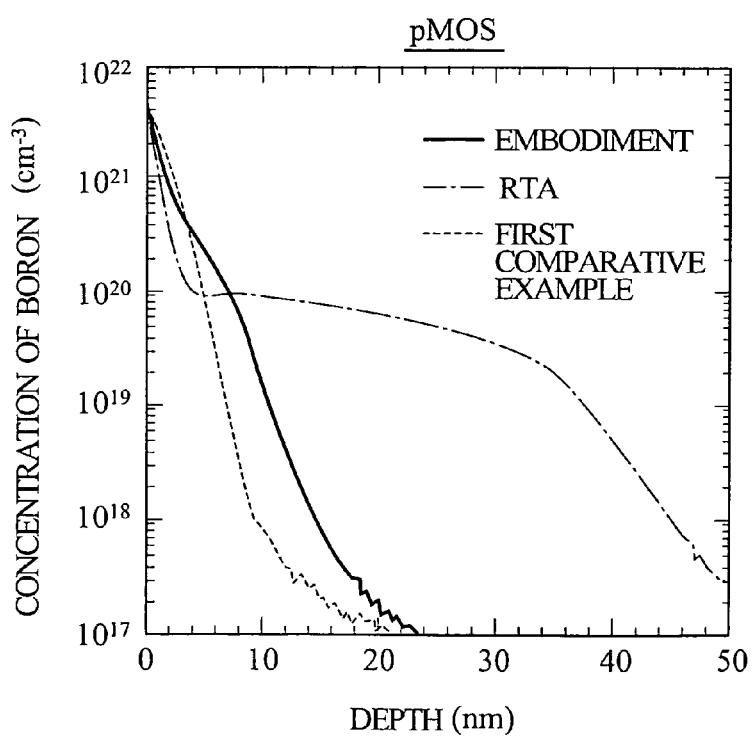
FIG. 10B is a graph showing a distribution of impurity concentrations of an extension region of the pMOS transistor according to the first comparative example.

As shown in FIGS. 10A and 10B, the impurity concentration distributions in the extension regions 6a and 6b of the nMOS transistor and the pMOS transistor were investigated by use of the SIMS. The axis of ordinates of FIG. 10A represents the concentrations of arsenic (As) in the extension region 6a of the nMOS transistor, and the axis of ordinates of FIG. 10B represents the concentrations of boron (B) in the extension region 6b of the pMOS transistor. The axes of abscissas of FIGS. 10A and 10B represent the depths of the extension regions 6a and 6b. As shown in FIGS. 10A and 10B, in the embodiment and the first comparative example, the concentrations of the impurities (As and B) are radically lowered from the surfaces (depth: 0 nm) of the extension regions 6a and 6b, and the impurities (As and B) are not detected in regions deeper than approximately 20 nm. However, as shown in FIG. 10A, in the RTA, arsenic with a concentration of approximately $10^{20}$ cm$^{-3}$ is detected through to a depth of approximately 20 nm from the surface of the extension region 6a, and arsenic continues to be detected through to a depth of approximately 40 nm. Moreover, as shown in FIG. 10B, in the RTA, boron continues to be detected through to a depth of 50 nm or more.

As described above, in the RTA treatment according to the related art, not only the impurities implanted into the gate electrodes 4a and 4b made of polycrystalline silicon but also the impurities implanted into the semiconductor substrate 1 made of monocrystalline silicon are diffused. Therefore, the shallow extension regions 6a and 6b of which depths are, for example, 20 nm or less cannot be formed.

SECOND COMPARATIVE EXAMPLE

In a method for manufacturing a semiconductor device according to a second comparative example of the embodiment, in FIG. 2B, the process in which phosphorus ions are implanted entirely into the polycrystalline silicon film 4 by use of the ion implantation method such that the concentration of the phosphorus ions can be $10^{19}$ cm$^{-3}$ or more is omitted. Moreover, the subsequent heat treatment process in which the phosphorus ions are diffused into the polycrystalline silicon film 4 is omitted. Only the process in which the polycrystalline silicon film 4 made substantially of the intrinsic semiconductor is deposited on the silicon oxide film 3 by use of the CVD method is conducted. With regard to the other manufacturing stages, the embodiment and the second comparative example are identical to each other.

With regard to the impurity concentration distributions of the gate electrodes 4a and 4b and the gate capacitances of the MOS transistors, the semiconductor device illustrated in FIG. 1 and the semiconductor device manufactured in accordance with the method for manufacturing a semiconductor device according to the second comparative example are compared with each other.

Figure 11A:
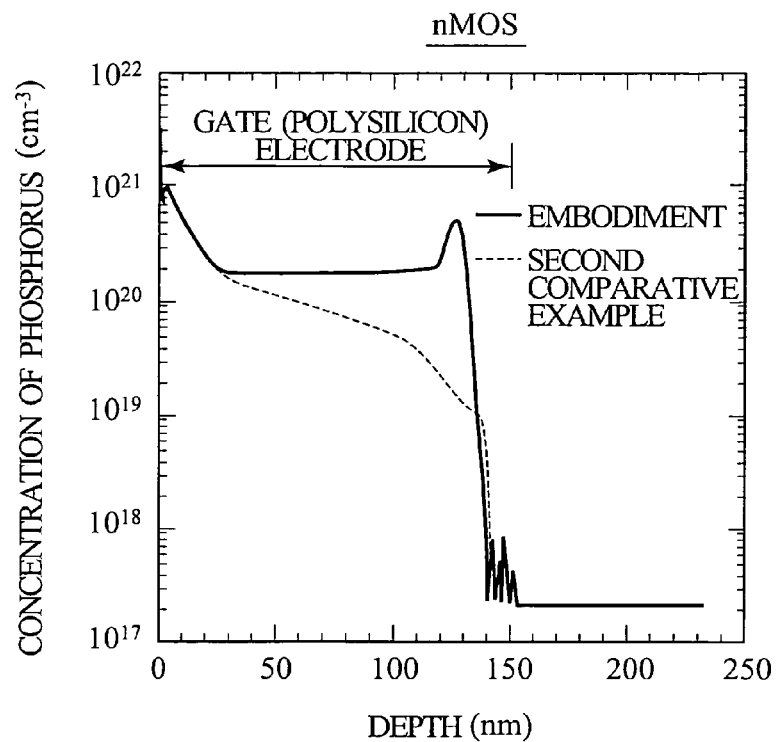
FIG. 11A is a graph showing a distribution of impurity concentrations of a gate electrode of an nMOS transistor according to a second comparative example.
Figure 11B:
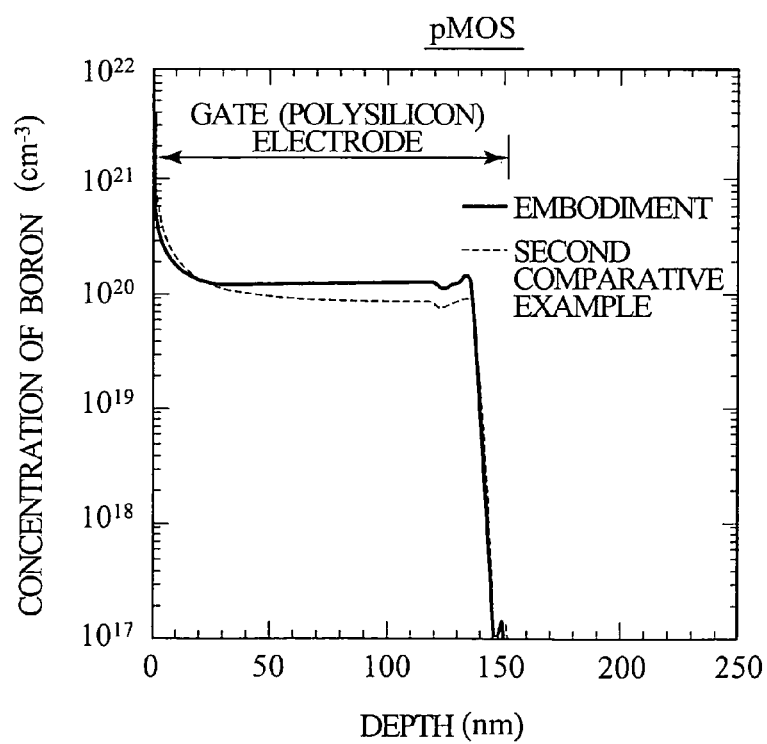
FIG. 11B is a graph showing a distribution of impurity concentrations of a gate electrode of a pMOS transistor according to the second comparative example.

As shown in FIGS. 11A and 11B, the impurity concentration distributions in the gate electrodes 4a and 4b made of polysilicon were investigated by use of the SIMS. The axis of ordinates of FIG. 11A represents concentrations of phosphorus (P) in the gate electrode 4a, and the axis of ordinates of FIG. 11B represents concentrations of boron (B) in the gate electrode 4b. The axes of abscissas of FIGS. 11A and 11B represent depths of the gate electrodes 4a and 4b. As shown in FIGS. 11A and 11B, the concentrations of the impurities (P and B) are substantially constant in the entire gate electrodes 4a and 4b in the embodiment. Moreover, as shown in FIG. 11B, the concentration of boron (B) is substantially constant in the entire gate electrode 4b also in the second comparative example. However, as shown in FIG. 11A, the concentration of phosphorus (P) is lowered from the midway of the gate electrode 4a of the nMOS transistor in the second comparative example.

Specifically, in the second comparative example, it is understood that, while the boron (B) is diffused uniformly into the entire gate electrode 4b in the pMOS transistor, a difference in concentration of phosphorus (P) occurs in the gate electrode 4a in the nMOS transistor, the impurity concentration of the gate bottom is low, and doped layers with insufficient concentrations are formed.

Figure 12A:
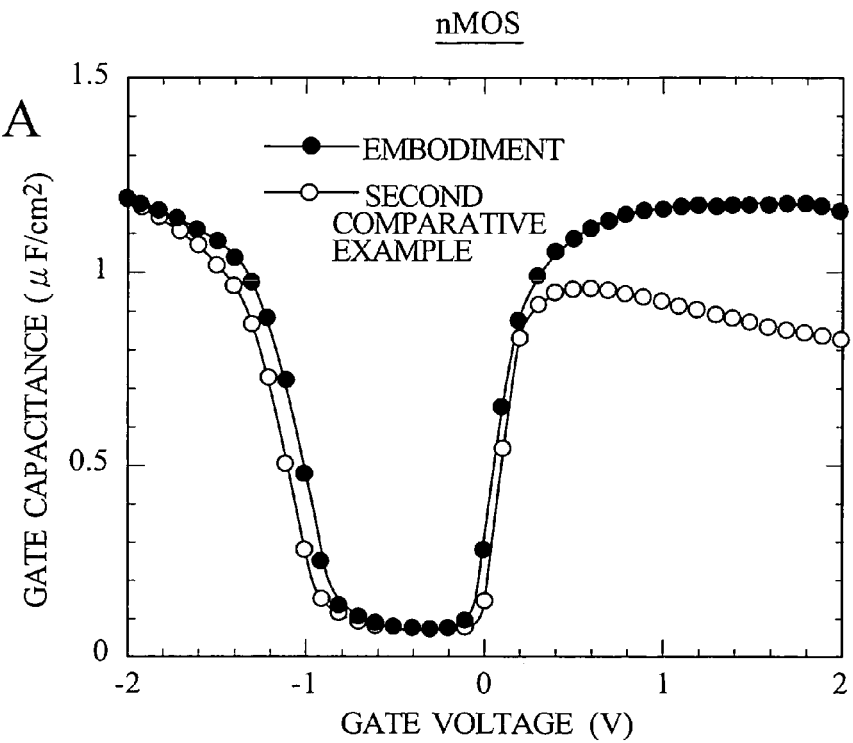
FIG. 12A is a graph showing a relationship between gate capacitances and gate voltages of the nMOS transistor according to the second comparative example.
Figure 12B:
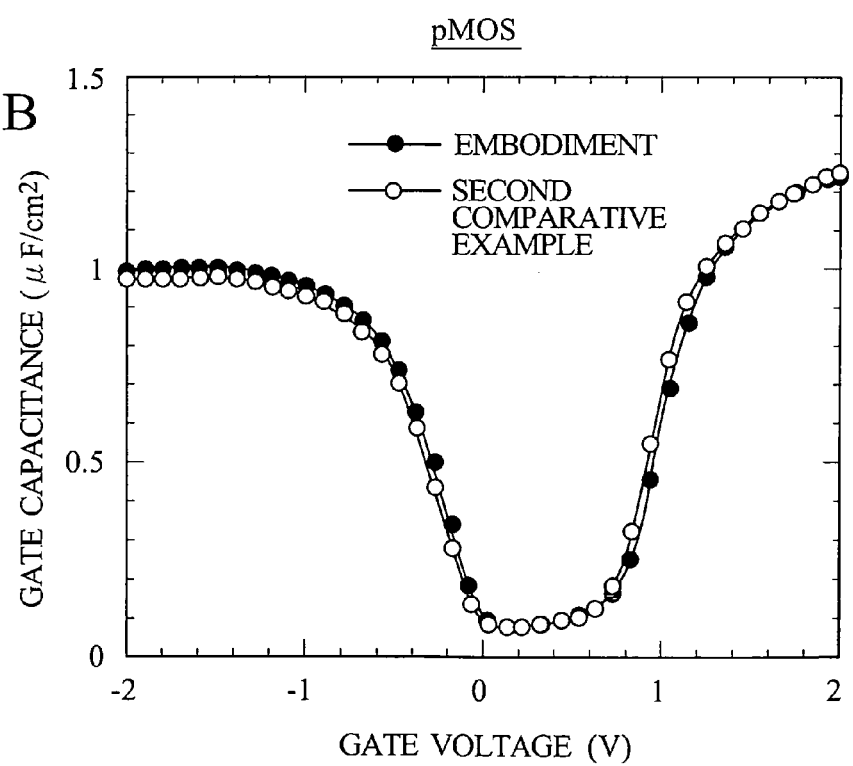
FIG. 12B is a graph showing a relationship between gate capacitances and gate voltages of the pMOS transistor according to the second comparative example.

As shown in FIGS. 12A and 12B, a relationship between the gate capacitance (C) and gate voltage (V) of each of the MOS transistors formed from the gate electrodes 4a and 4b, the gate insulating films 3a and 3b and the wells 18 and 19 was investigated. The axes of ordinates of FIGS. 12A and 12B represent the gate capacitances, and the axes of abscissas thereof represent the gate voltages thereof.

As shown in FIG. 12B, the pMOS transistors according to the embodiment and the second comparative example substantially coincide with each other in C-V characteristics, and each pMOS transistor has a gate capacitance of approximately 1.0 µF/cm$^2$ when the gate voltage is –1.5V. As shown in FIG. 12A, the nMOS transistor according to the embodiment has a gate capacitance of approximately 1.15 µF/cm$^2$ when the gate voltage is 1.5V. However, in the second comparative example, the nMOS transistor has a gate capacitance of approximately 0.85 µF/cm$^2$ when the gate voltage is 1.5V. This gate capacitance is lower as compared with that of the embodiment.

As described above, boron (B) is diffused into the entire gate electrode 4b of the pMOS transistor in the second comparative example, and therefore, the embodiment and the second comparative example substantially coincide with each other in gate capacitance of the pMOS transistor. However, a doped layer with insufficient concentrations is formed in the gate electrode 4a of the nMOS transistor, and therefore, the gate capacitance of the nMOS transistor in the second comparative example is lowered as compared with that in the embodiment. Specifically, it is understood that the gate insulating film 3a under the gate electrode 4a is formed apparently thick.

Such a difference between the nMOS transistor and the pMOS transistor in the second comparative example originates mainly from a difference in the ease of diffusion between the n-type impurity and the p-type impurity in the gate electrodes 4a and 4b. Specifically, the heat treatment conditions in the case of diffusing the impurities into polysilicon differ between the n-type impurity and the p-type impurity. The process window of the nMOS transistor is narrower as compared with that of the pMOS transistor. Prior to the p-type impurity of the pMOS transistor, the n-type impurity doped to the gate electrode 4a of the nMOS transistor in which the process window is narrower is doped into the polycrystalline silicon film 4 for which the shape has not yet been processed as illustrated in FIG. 2B, and then a sufficient diffusion treatment is performed therefor. Therefore, the treatment conditions for the pre-annealing are reduced more than those of the RTA treatment according to the related art (1015° C. and 10 sec). Specifically, in such conditions, the temperature can be lowered, and the time can be shortened. Hence, the depths of the extension regions 6a and 6b in which the impurity concentrations become approximately $10^{18}$ cm$^{-3}$ are restricted to be 20 nm or less, and simultaneously, the resistances of the extension regions 6a and 6b can be lowered. Thus, a stable process in which the lowering of yield is controlled can be expected.

As described above, the method for manufacturing a semiconductor device according to the embodiment of the present invention includes the plurality of heat treatment processes differing in heat treatment temperature and time in the event of activating the impurity ions implanted individually into the polycrystalline and monocrystalline silicons. Specifically, the annealing at a low temperature for a long time is conducted, and only the impurity ions in the polycrystalline silicon are selectively diffused. Then, to finish, the entire implanted impurity ions are activated in high concentration by irradiation of high-brightness light at a high temperature for an extremely short time, for example, the light from a flash lamp. The diffusion of the impurity ions implanted into the monocrystalline silicon can be controlled, and simultaneously, the depletion of the gate electrodes made of the polycrystalline silicon can be prevented. Hence, the low-resistant and shallow extension regions 6a and 6b can be formed, and simultaneously, the impurity ions in the gate electrodes 4a and 4b can be diffused sufficiently. It becomes possible then to control the profiles of the impurities precisely, and a high-performance MOS transistor having a shallow junction corresponding to the miniaturization can be manufactured stably with ease.

MODIFICATION EXAMPLE OF EMBODIMENT

Although the case of implanting the n-type impurity ions to the entire polycrystalline silicon film 4 as illustrated in FIG. 2B has been described in the embodiment, the present invention is not limited to this. It is desirable that the impurity ions of the first conductivity type be implanting into at least a region in the polycrystalline silicon film 4, where the gate electrode 4a is formed.

Figure 13:
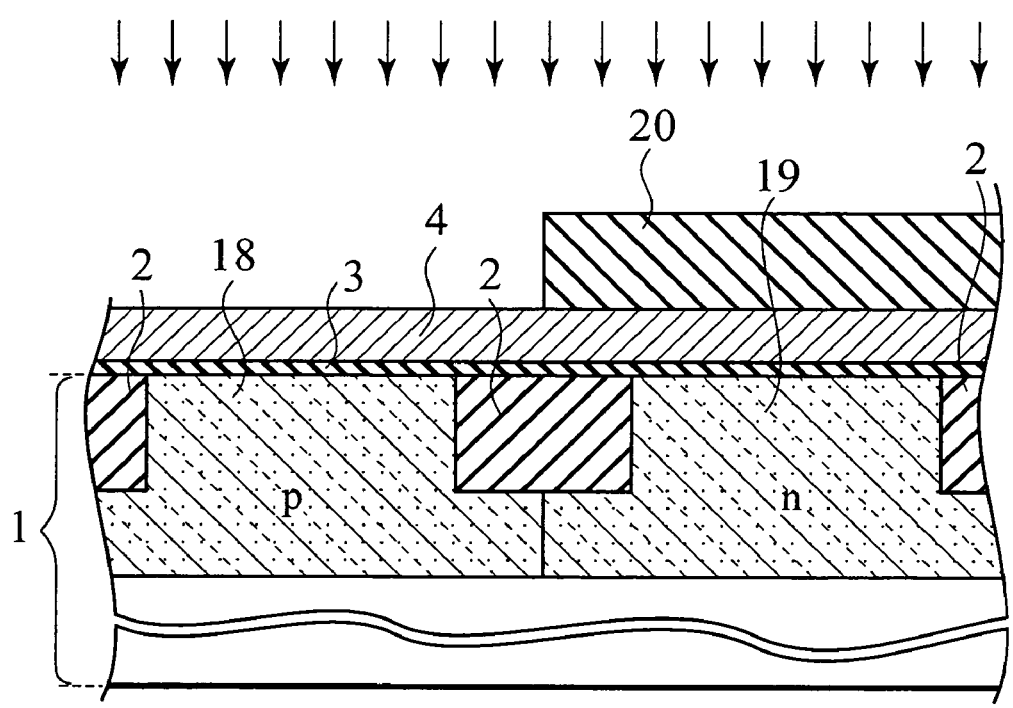
FIG. 13 is a cross-sectional diagram illustrating a part of principal manufacturing stages in a method for manufacturing a semiconductor device according to a modification example of the embodiment of the present invention.

As illustrated in FIG. 13, in the modification example of the embodiment, the polycrystalline silicon film 4 substantially made of an intrinsic semiconductor is deposited, followed by deposition of a resist film by the spin-coating method. The resist film is selectively removed by use of the photolithography method, thus forming the resist pattern 20 which has an opening in a region where the p-well 8 is formed. The n-type impurity ions are selectively implanted into the polycrystalline silicon film 4 on the p-well 18 by use of the resist pattern 20 as a mask for the implanted ions. The ion implantation conditions in this case are identical to those of the embodiment. In addition, with regard to the other manufacturing processes, the embodiment and the modification example are identical to each other.

Also in accordance with the modification example of the embodiment, the depletion of the gate electrodes 4a and 4b can be restricted, and simultaneously, the extension regions 6a and 6b and the source/drain regions 10a and 10b can be formed shallow. Moreover, the impurity diffusion in the direction parallel to the surface of the semiconductor substrate 1 can be prevented, thus making it possible to control the short channel effect.

It is also thought that, before the shape of the polycrystalline silicon film is processed, not only are the n-type impurity ions selectively implanted into the polycrystalline silicon film 4 on the p-well 18, but also the p-type impurity ions are selectively implanted into the polycrystalline silicon film 4 on the n-well 19. However, in this case, the etching rate of the RIE differs between the n-type polycrystalline silicon film 4 and the p-type polycrystalline silicon film 4, and therefore, the process precision of the gate electrodes 4a and 4b deteriorates. Hence, a stable process is not obtained, thus lowering the driving power of the transistor.

Meanwhile, in the case of the modification example, in the event of processing the gate electrodes 4a and 4b illustrated in FIG. 2C, the n-type polycrystalline silicon film (n-type doped region) 4 and the polycrystalline silicon film (n-type undoped region) made of the intrinsic semiconductor will be etched simultaneously. Because the etching rate is substantially equal between the n-type doped region and the n-type undoped region, precisely processed gate electrodes 4a and 4b can be formed. Moreover, because the n-type impurity ions are not implanted into the polycrystalline silicon film 4 on the n-well 19, excessive ion implantation for inverting the conductivity type of the gate electrode 4b into the p type can be avoided in the ion implantation process illustrated in FIG. 4B. Hence, the implantation amount of the p-type impurity can be restricted without increasing the resistance of the gate electrode 4b, thus making it possible to lead to the stabilization of the process.

As described above, according to the embodiment of the present invention, the method for manufacturing a semiconductor device having low-resistant and shallow impurity diffusion layers and being equipped with good driving power can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
    forming first and second insulating gate portions to be spaced from each other on a semiconductor substrate, the first insulating gate portion including a first gate insulating film and a first gate electrode doped with an impurity of a first conductivity type, and the second insulating gate portion including a second gate insulating film and a second gate electrode doped with an impurity of a second conductivity type;
    selectively implanting impurity ions of the first conductivity type to the first gate electrode and a surface layer of the semiconductor substrate adjacent to the first insulating gate portion;
    selectively implanting impurity ions of the second conductivity type to the second gate electrode and the surface layer adjacent to the second insulating gate portion;
    after implanting the impurity ions of the first and second conductivity types, performing pre-annealing at a first substrate temperature; and
    after the pre-annealing, performing main activation for the impurity ions of the first and second types at a second substrate temperature higher than the first substrate temperature for a treatment period shorter than a period of the pre-annealing.

2. The method of claim 1, wherein the forming first and second insulating gate portions comprises:
    forming an insulating film on the semiconductor substrate;
    forming a polycrystalline conductive film doped with the impurity of the first conductivity type on the insulating film; and
    selectively removing the insulating film and the polycrystalline conductive film to form the first and second gate insulating films and the first and second gate electrodes.

3. The method of claim 2, wherein the forming first and second insulating gate portions further comprises forming first and second sidewall spacers on the semiconductor substrate, the first sidewall spacer being adjacent to the first gate insulating film and the first gate electrode, and the second sidewall spacer being adjacent to the second gate insulating film and the second gate electrode.

4. The method of claim 2, wherein the forming a polycrystalline conductive film comprises:
    depositing a polycrystalline conductive film made substantially of an intrinsic semiconductor on the insulating film;
    implanting the impurity ions of the first conductivity type at least to a region where the first gate electrode is formed in the polycrystalline conductive film; and
    diffusing the impurity ions of the first conductivity type into the polycrystalline conductive film.

5. The method of claim 3, wherein the selectively implanting impurity ions of the first conductivity type comprises:
    selectively implanting the impurity ions of the first conductivity type to the first gate electrode and the surface layer adjacent to the first gate electrode; and
    selectively implanting the impurity ions of the first conductivity type to the surface layer and the first gate electrode, both of which are adjacent to the first sidewall spacer.

6. The method of claim 5, wherein selectively implanting impurity ions of the first conductivity type further comprises performing sub-activation for the impurity ions of the first conductivity type at the second substrate temperature for a treatment period shorter than the period of the pre-annealing after selectively implanting the impurity ions of the first conductivity type to the first gate electrode and the surface layer adjacent to the first gate electrode, and before selectively implanting the impurity ions of the first conductivity type to the surface layer and the first gate electrode.

7. The method of claim 3, wherein the selectively implanting impurity ions of the second conductivity type comprises:
selectively implanting the impurity ions of the second conductivity type to the second gate electrode and the surface layer adjacent to the second gate electrode; and
selectively implanting the impurity ions of the second conductivity type to the surface layer and the second gate electrode, both of which are adjacent to the second sidewall spacer.

8. The method of claim 7, wherein selectively implanting impurity ions of the second conductivity type further comprises performing sub-activation for the impurity ions of the second conductivity type at the second substrate temperature for the treatment period shorter than the period of the pre-annealing after selectively implanting the impurity ions of the second conductivity type to the second gate electrode and the surface layer adjacent to the second gate electrode, and before selectively implanting the impurity ions of the second conductivity type to the surface layer and the second gate electrode.

9. The method of claim 1, wherein the first substrate temperature $T_1$ (° C.) and the treatment period $t_{pa}$ (sec) of the pre-annealing satisfy a relationship represented by a following equation:

$$5\times10^{-8}\exp[2.21\times10^4/(T_1+275)] \leq t_{pa} \leq 6\times10^{-13}\exp[3.74\times10^4/(T_1+275)].$$

10. The method of claim 9, wherein the first substrate temperature ranges from 600° C. to 900° C.

11. The method of claim 9, wherein the treatment period of the pre-annealing ranges from 5 seconds to $3.6\times10^3$ seconds.

12. The method of claim 4, wherein the pre-annealing and the diffusing the impurity ions of the first conductivity type into the polycrystalline conductive film are performed by use of any of an infrared lamp, and an electric furnace and hot plate operated by resistance heating.

13. The method of claim 1, wherein the treatment period of the main activation is 100 ms or less.

14. The method of claim 13, wherein surface density of irradiation energy of light emitted from a light source for use in the main activation on a surface of the semiconductor substrate is 100 J/cm$^2$ or less.

15. The method of claim 14, wherein the light source is a flash lamp into which a rare gas is enveloped.

16. The method of claim 14, wherein the light source is an excimer laser or a YAG laser, each oscillating a laser beam in a pulse shape.

17. The method of claim 4 further comprising performing pre-heating at a third substrate temperature approximately equal to/less than a temperature at the diffusing the impurity ions of the first conductivity type into the polycrystalline conductive film before the main activation, wherein the main activation is performed subsequently to the pre-heating.

18. The method of claim 17, wherein the third substrate temperature ranges from 200° C. to 600° C.

19. The method of claim 17, wherein the pre-heating is performed by an infrared lampora hot plate.

* * * * *